US006345990B1

(12) United States Patent
Hyzin

(10) Patent No.: US 6,345,990 B1
(45) Date of Patent: Feb. 12, 2002

(54) COMBINED STACKING AND RIGHT ANGLE ELECTRICAL CONNECTOR

(75) Inventor: Peter Joseph Hyzin, Trabuco Canyon, CA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 09/676,765

(22) Filed: Oct. 2, 2000

(51) Int. Cl.[7] ........................ H01R 12/00; H05K 1/00

(52) U.S. Cl. ........................ 439/79; 439/74

(58) Field of Search ........................ 439/78, 79, 80, 439/74, 83, 108

(56) References Cited

U.S. PATENT DOCUMENTS

| | | | | | |
|---|---|---|---|---|---|
| 3,588,785 | A | | 6/1971 | Hardardt et al. | |
| 3,596,235 | A | | 7/1971 | Hendriklaan | |
| 3,601,762 | A | * | 8/1971 | Eshelman | 439/246 |
| 3,805,117 | A | | 4/1974 | Hausman | 317/101 |
| 3,897,994 | A | * | 8/1975 | Errichiello | 439/697 |
| 4,568,136 | A | | 2/1986 | Reuss | |
| 4,806,105 | A | | 2/1989 | Muzslay | 439/74 |
| 4,813,881 | A | | 3/1989 | Kirby | 439/74 |
| 4,934,945 | A | | 6/1990 | Nakamura | 439/75 |
| 5,000,690 | A | | 3/1991 | Sonobe et al. | 439/76 |
| 5,013,250 | A | | 5/1991 | Schulz | 439/79 |
| 5,556,285 | A | | 9/1996 | Ono | 439/74 |
| 5,772,452 | A | | 6/1998 | Aoyama | 439/74 |
| 5,797,757 | A | | 8/1998 | Aoki | 439/101 |
| 5,876,240 | A | * | 3/1999 | Derstine et al. | 439/490 |
| 6,000,955 | A | * | 12/1999 | Zaderej | 439/79 |

* cited by examiner

*Primary Examiner*—Neil Abrams
*Assistant Examiner*—Brian S. Webb
(74) *Attorney, Agent, or Firm*—Roger C. Turner

(57) ABSTRACT

A combined stacking and right angle electrical connector is mounted between a pair of parallel circuit boards. Stacking contacts mounted in the connector body have sockets on their opposite ends that releasably engage pins mounted in the circuit boards. A plurality of right angle contact assemblies are provided in the connector body. Each contact assembly includes two separate contact parts that are mounted from different sides of the connector body into contact passages that are perpendicular to each other.

17 Claims, 4 Drawing Sheets

COMBINED STACKING AND RIGHT ANGLE ELECTRICAL CONNECTOR

BACKGROUND OF THE INVENTION

The present invention relates generally to an electrical connector and, more particularly, to a combined circuit board stacking and right angle electrical connector.

For certain electrical interconnect applications it is necessary to provide both circuit board stacking and right angle interconnecting functions. This is typically accomplished by using a two-part separable connector for the stacking interconnect function and an additional connector for the right angle interconnect function.

The foregoing conventional arrangement has a number of shortcomings if it becomes necessary to replace the circuit boards, or devices on the boards, or replace the connectors if the contacts therein become damaged. In the case of both types of connectors, if it is necessary to separate the connectors from the circuit board, one must desolder all of the contacts to remove the connector from the board. Even if the contacts are press-fit into holes in the board, rather than soldered, it is very difficult to remove the connector from the board without damaging either the board or the connector, or the contacts therein.

In the case of the conventional multi-row right angle connector, right angle contacts of different lengths are mounted in a common plane, one behind the other. If one of the right angle contacts behind the first row of contacts becomes damaged, all of the contacts in front of the damaged contact must be removed in order to replace the damaged contact. This is time-consuming, and sometimes results in some of the right angle contacts becoming damaged during the replacement operation.

One object of the present invention is to provide a single connector assembly that combines circuit board stacking and right angle interconnecting functions and can be readily removed from the circuit boards if the boards or the connector require repair.

It is another object of the present invention to provide a right angle connector in which each right angle contact may be easily removed even in the case where the contact is mounted behind additional right angle contacts, without removing such additional contacts.

SUMMARY OF THE INVENTION

According to a principal aspect of the present invention, there is provided an electrical connector that integrates circuit board stacking and right angle interconnecting functions. The connector contains straight stacking contacts that extend between opposite faces of the connector body against which the circuit boards are mounted. The contacts having mating end sections adjacent to such faces. A plurality of right angle contact assemblies are also mounted in the connector body. One end of the right angle contacts terminate adjacent to one of the faces of the connector body and also include mating end sections. The mating end sections of the stacking contacts and right angle contacts are releasably connected to mating contacts on the circuit boards so that the boards can be released from the connector without desoldering and without the force required to separate press-fit contacts as in the conventional interconnect assembly, as described earlier herein, that can result in damage to the boards. The interconnection between the contacts in the connector and the boards is a simple pin and socket connection.

According to another aspect of the present invention, there is provided a right angle electrical connector. Each right angle contact is a two-part contact assembly in which the inner ends of the contact parts interconnect with each other at an intersection point between right angle contact passages that meet in the connector body. Even if a particular right angle contact assembly is mounted behind another contact assembly in the connector body, the inner contact assembly can be removed by simply removing the separate contact parts out of the connector body through the respective right angle contact passages.

Other aspects and advantages of the invention will become more apparent from the following description taken in connection with the accompanying drawings.

DESCRIPTION OF THE PREFERRED EMBODIMENTS

Figure 1:
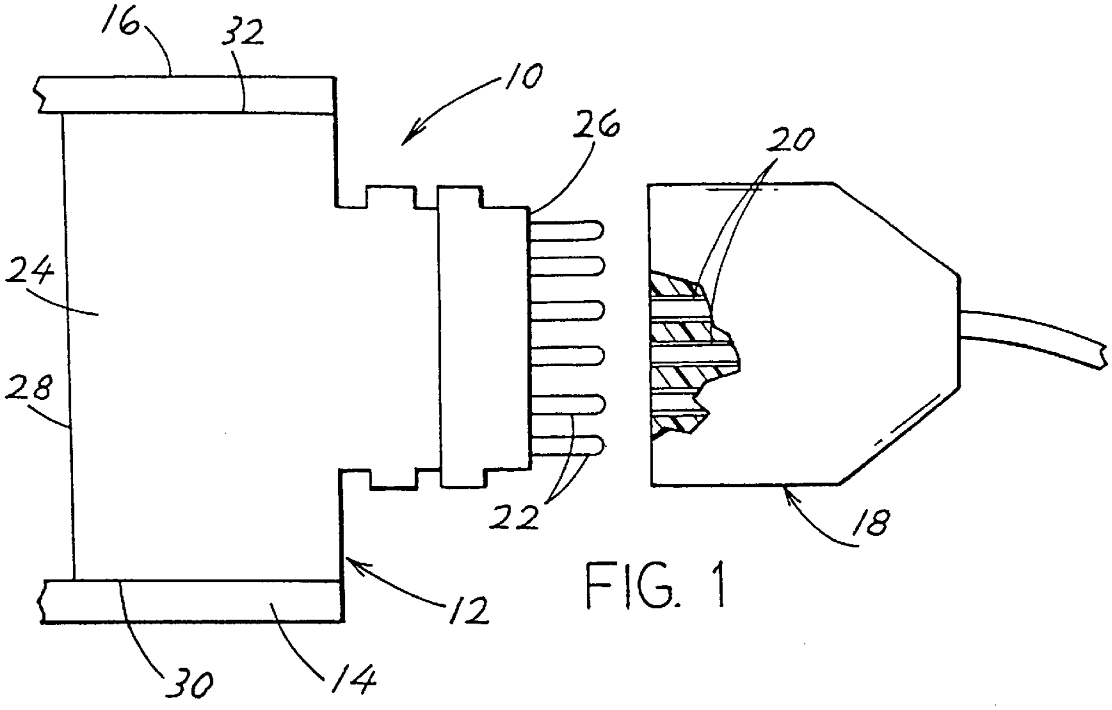
FIG. 1 is a top view of the interconnect assembly of the present invention, with the combined stacking and right angle connector mounted between two circuit boards, and a mating cable connector illustrated partially in section to show socket contacts therein.

Referring now to the drawings in detail, there is shown in FIG. 1 the interconnect assembly of the present invention, generally designated 10, comprising a combined stacking and right angle connector 12 mounted in a stacked relationship between two parallel circuit boards 14 and 16. FIG. 1 shows a cable connector 18 containing socket contacts 20 that mate with pins 22 that extend from the right side of the connector 12, as viewed in FIG. 1. Alternatively, the cable connector could be replaced by a motherboard containing a row of plated-through holes that receive the pins 22. In such an arrangement, the circuit boards 14 and 16 would become daughterboards relative to the motherboard.

Figure 2:
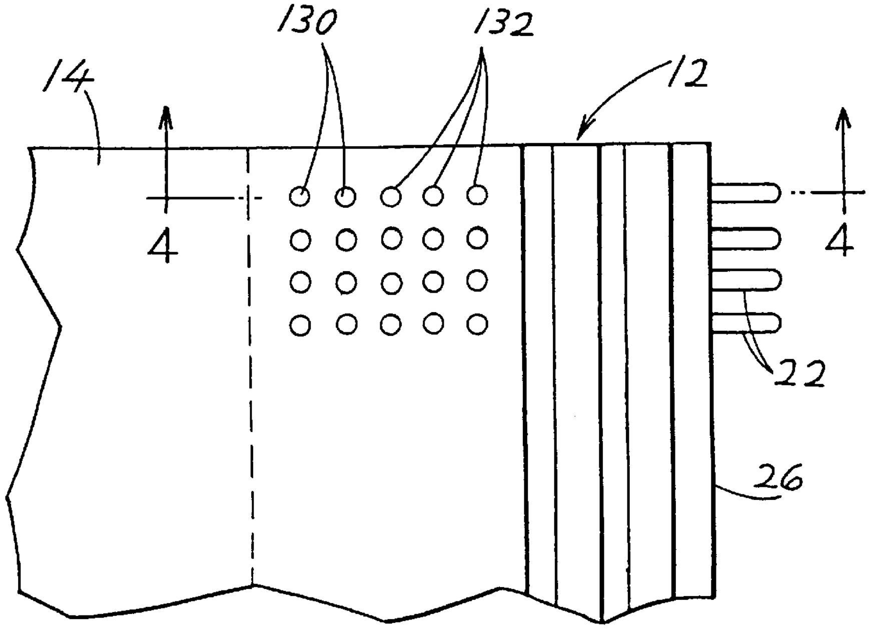
FIG. 2 is a fragmentary side view of the interconnect assembly shown in FIG. 1.
Figure 3:
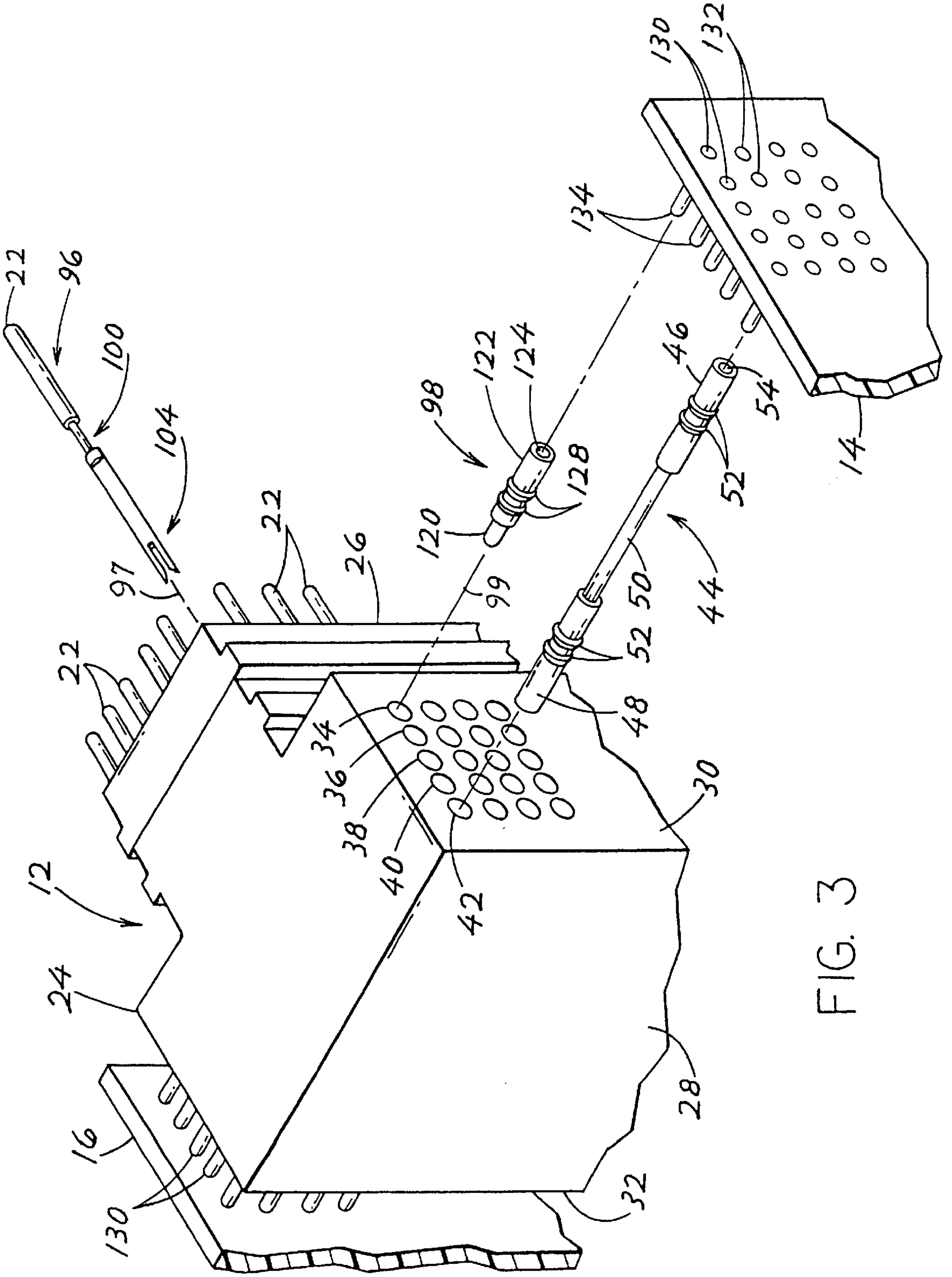
FIG. 3 is an exploded, isometric view of the interconnect assembly shown in FIG. 1, with three of the different contacts of the combined stacking and right angle connector shown outside of the connector body.
Figure 4:
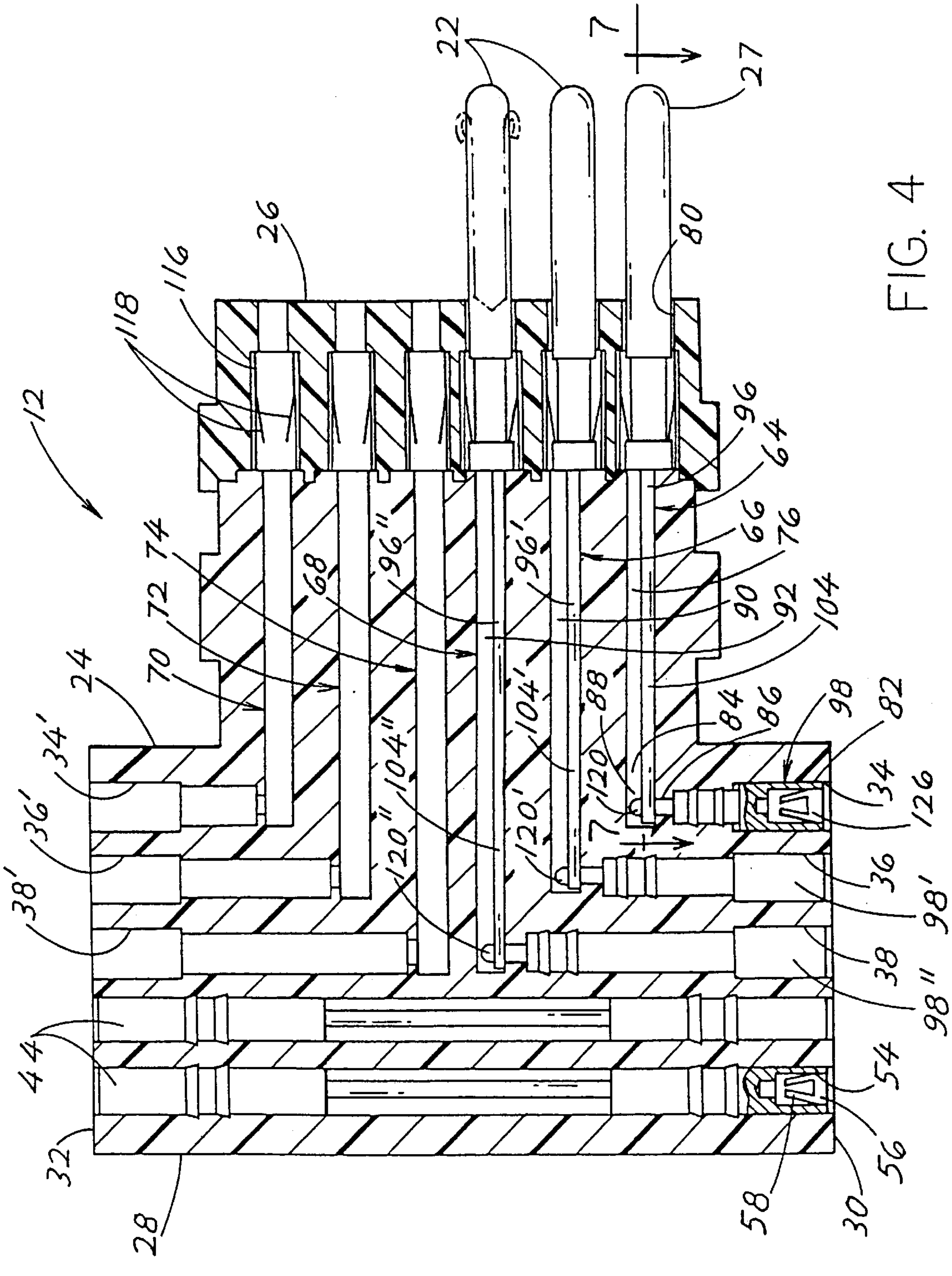
FIG. 4 is a horizontal sectional view taken along line 4—4 of FIG. 2 showing the arrangement of the contact passages in the connector body, with right angle contact assemblies mounted in three of the right angle cavities in the connector body, and stacking contacts mounted in two passages in the body.

Referring now to FIGS. 2–4 in detail, the connector 12 comprises a generally rectangular insulative body 24 having opposite side surfaces 26 and 28. The surface 26 is considered to be the front surface and the surface 28 the rear surface. The connector body also includes opposite faces 30 and 32 that are perpendicular to the surfaces 26 and 28. When the interconnect assembly 10 is fully assembled, the face 30 of the connector 12 is flush with the circuit board 14 and the opposite face 32 is flush with the second circuit board 16.

In the embodiment of the invention illustrated in the drawings, there are provided five vertical rows of passages 34, 36, 38, 40, and 42. Each of the passages opens at the face 30 of the connector body 24. While only four passages are shown in each of the vertical rows, it will be appreciated that in reality there will be a substantially larger number of passages in the vertical rows. In addition, there may be more or less of the vertical rows of passages in the connector body, depending upon the particular application for which the connector 12 of the invention is used.

The passages 40 and 42 are actually through-holes, as best seen in FIG. 4. That is, the holes extend between the opposite faces 30 and 32 of the connector body. A stacking contact 44 is mounted in each of the through-holes 40 and 42. The stacking contact has mating end sections 46 and 48 interconnected by a central section 50. Annular retention ribs 52 are formed on the outer surfaces of the mating end sections 46 and 48 of the stacking contact for frictionally retaining the stacking contact in the through-hole in the connector body. Preferably, each mating end section 46 and 48 is in the form of a socket contact containing a bore 54. The terminal ends of the mating end sections 46 of the stacking contact 44 are located immediately adjacent to, but spaced slightly behind the opposite faces 30 and 32 of the connector body.

In the preferred embodiment of the invention, a spring clip 56 is mounted in the bore 54 in each of the mating end sections 46 of the stacking contact. Two of such clips are illustrated in FIG. 4. The spring clip is generally referred to in the art as being a "star clip." The clip has a plurality of inwardly and rearwardly extending resilient tines 58 that engage pins mounted on the circuit boards 14 and 16 to be described in greater detail later herein.

The connector 12 of the present invention also includes a plurality of right angle contact assemblies (to be described later herein) that are mounted in corresponding right angle cavities in the connector body 24. Six of such cavities are shown in FIG. 4 by way of example only, and are denoted by reference numerals 64, 66, 68, 70, 72, and 74.

The right angle cavity 64 comprises a first passage 76 that extends perpendicular to the front surface 26 of the connector body and the passage 34 that is perpendicular to the passage 76. The outer end 80 of the first passage 76 opens at the surface 26, while the outer end 82 of passage 34 opens at the face 30 of the connector body as previously described. The inner end 84 of passage 76 intersects the inner end 86 of passage 34 at an intersection point 88.

The second right angle cavity 66 in the connector body includes a first passage 90 that is perpendicular to the front surface 26, and is parallel to and longer than the first passage 76. The second cavity also includes the passage 36, the inner end of which intersects the inner end of the passage 90 similar to the right angle cavity 64. The third right angle cavity 68 includes a passage 92 perpendicular to the front surface 26. The passage 92 is longer than the passage 90. The inner end of the passage 92 intersects the inner end of the passage 38 that opens up at face 30 of the connector body. Thus, each of the right angle cavities 64, 66, and 68 are similar, except that those that are positioned more remote from the front surface 26 and face 30 of the connector body have longer passages. In other words, each successive passage for the group of right angle cavities 64, 66, and 68 are longer than the preceding passages.

The right angle cavities 70, 72, and 74 are identical to the cavities 64, 66, and 68, respectively, except that passages 34', 36', and 38' thereof open at the face 32 of the connector body, rather than at the face 30.

Figure 8:
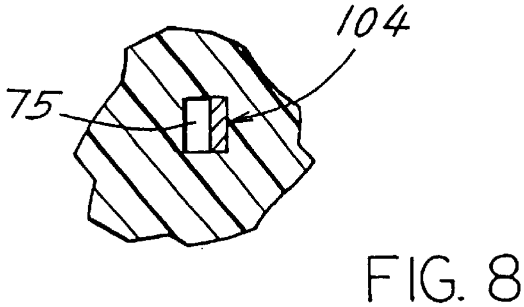
FIG. 8 is a sectional view taken along line 8—8 of FIG. 7.

As seen in FIG. 8, the passages 76, 90, and 92 have a rectangular cross-section. A side portion 75 of the first cavity, which holds the first contact part, is empty to receive a coupling section of the second contact part.

Figure 5:
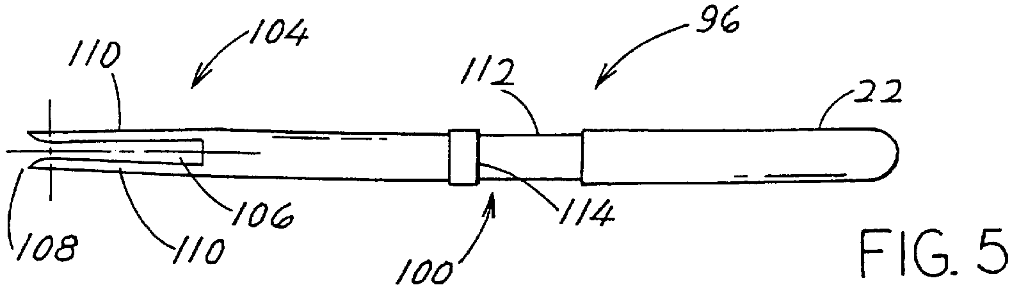
FIG. 5 is a side view of one of the right angle contact parts shown in FIGS. 3 and 4.
Figure 6:
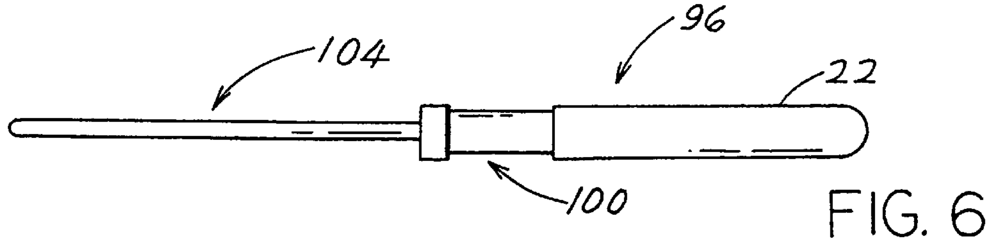
FIG. 6 is a top view of the contact part shown in FIG. 5.
Figure 7:
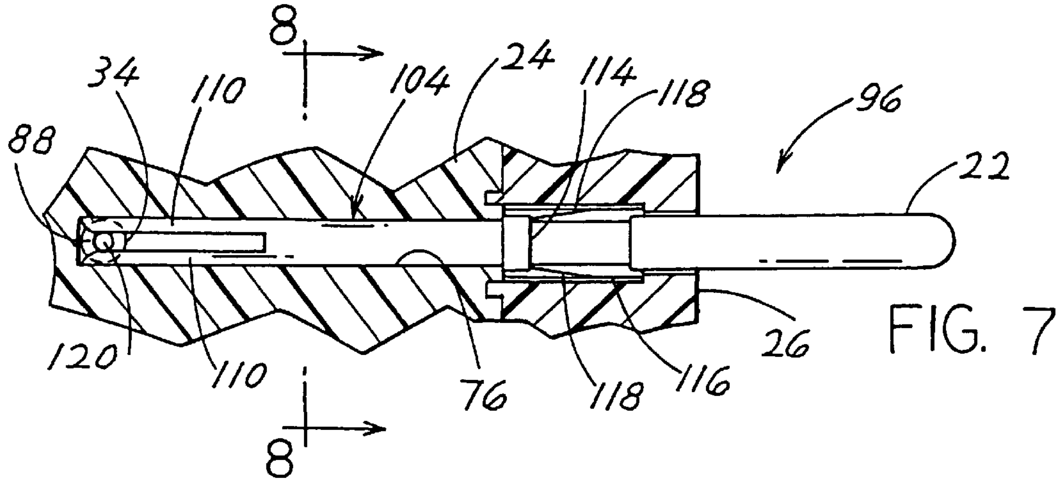
FIG. 7 is a vertical sectional view taken along line 7—7 of FIG. 4.

FIG. 4 shows three right angle contact assemblies mounted in the cavities 64, 66, and 68. In actual practice, right angle contact assemblies would also be mounted in cavities 70, 72, and 74. The right angle contact assembly for the first right angle cavity 64 in the connector body consists of a first right angle contact part 96, and a second right angle contact part 98, that are separate elements with perpendicular axes 97, 99. The figures shows that the walls of each passage substantially completely surround each contact. As best seen in FIGS. 3, 5, and 6, the first right angle contact part 96 comprises a generally cylindrical central section 100, the outer mating section 22 which is a cylindrical pin, and an inner coupling section 104. The inner coupling section is generally flat, and is formed with a slot 106 that opens at the forward end 108 of the contact part. The slot forms a pair of resilient arms 110 that are inclined toward each other at their front ends. Thus, the inner coupling section 104 of the contact part 96 is generally in the form of a tuning fork contact. An annular groove 112 is formed in the central section of the contact part providing a rearwardly facing annular shoulder 114. While the outer mating section 22 of the contact part 96 is shown as being a cylindrical pin, it also could be formed as a socket contact if the mating contacts in the cable connector 18 were pin contacts, or it could be a press-fit contact for engaging plated-through holes in a motherboard that is used in the place of a cable connector 18.

When the contact part 96 is mounted in the passage 76 of the right angle cavity 64 from the front surface 26 of the connector body, the inner coupling section 104 of the contact part will be disposed adjacent to the inner end 84 of the passage. The contact part 96 is releasably retained in the passage 76 by means of a contact retention clip 116 mounted in the passage near the front surface 26. The clip has inwardly extending resilient retention fingers 118 that engage the shoulder 114 of the contact part to retain it in position. As well known in the art, a suitable tool may be inserted into the passage 76 to release the tines 118 from behind the shoulder 114 to allow removal of the contact part 96 from the passage.

A second right angle contact part 96' is mounted in the passage 90. The part 96' is identical to the part 96, except that its inner coupling section 104' is longer so that it extends the length of the passage. The contact part 96" mounted in the passage 92 is also identical to the part 96, except that its inner coupling section 104" is longer than both the inner coupling sections of the contact parts 96 and 96'. With the first right angle contact parts mounted in the connector body, the slots 106 formed in the inner coupling sections of the contacts are aligned with the passages 34, 36, and 38, respectively, in the connector body.

The second right angle contact part 98 comprises a generally cylindrical body having an inner coupling section 120 in the form of a cylindrical pin, and an outer mating section 122 in the form of a socket contact. The outer section 122 is formed with a bore 124 that receives a star clip 126 similar to the clip 56. Annular retention ribs 128 are formed on the body of the contact part 98.

When the second right angle contact part 98 is mounted in the passage 34, as shown in FIG. 4, the outer mating section 122 of the part is closely adjacent to, but positioned slightly behind, the face 30 of the connector body, and the inner cylindrical pin 120 extends into the slot 106 in the first right angle contact part 96. Normally, the contact part 98 will be mounted in the passage 34 prior to mounting the first right angle contact part 96 into the passage 76. When the contact part 96 is inserted into the passage 76, the arms 110 of the inner coupling section of the part will spread apart to capture the pin 120 therein so that the two contact parts will be firmly interconnected for reliable electrical engagement with each other.

A second right angle connector part 98', longer than the part 98, is mounted in the contact passage 36 with its pin section 120' engaged in the inner coupling section 104' of the contact part 96'. Likewise, another right angle contact part 98" is mounted in the passage 36 with its inner cylindrical pin 120" engaged with the inner coupling section 104" of the contact part 96". Additional right angle contact parts, not shown, would be mounted in the right angle contact cavities 70, 72, and 74 in the connector body.

As will be appreciated by examining FIG. 4, all the contact passages, the stacking contacts, and the right angle contact assemblies lie in a common plane that is perpendicular to the side surfaces 26,28 and faces 30,32 of the connector body 24. FIG. 3 shows four horizontally extending rows of passages in the connector body. Each successive horizontal row of passages, and the contacts mounted therein, lie in common planes, with the planes being parallel to each other.

The right angle contact part 98, as well as the stacking contact 44, are removable from their respective contact passages in the connector body since they are retained therein by friction by the engagement of the retention ribs 128 and 52, respectively, with the walls of the passages.

As seen in FIG. 3, the two circuit boards 14 and 16 contain multiple rows of connecting elements 130. The connecting elements are positioned in a pattern corresponding to the pattern of the passages in the connector body 24 that open at the faces 30 and 32. The connector elements are mounted in plated-through holes 132 in the boards 14 and 16. Each connector element has a forwardly extending mating section 134 which, in the embodiment illustrated in the drawings, is in the form of a pin. When the circuit boards 14 and 16 are mounted against the faces 30 and 32 of the connector 12, the pins 134 will engage the star clip socket sections of the right angle contacts and stacking contacts that are exposed at the faces of the connector. Alternatively, the outer ends of the stacking contacts, and the outer ends of the second right angle contact parts, could be formed as pins that extend beyond the faces 30 and 32 of the connector body, and the connecting elements 130 in the boards 14 and 16 could be in the form of sockets mounted in the plated-through holes in the boards. In either case, the pin and socket interengagement arrangement permits a relatively easy separation of the boards from the combined stacking and right angle connector 12 of the present invention without the requirement of desoldering electrical connections, or using substantial force with tools to separate the parts as is necessary with conventional press-fit interconnection arrangements that can result in damage to the boards, connectors, or contacts mounted therein.

A major advantage of the connector of the present invention is that it integrates circuit board stacking and right angle interconnecting functions, thus avoiding the need for two separate connectors as used in prior interconnect systems of the type to which this invention pertains. Further, servicing of the right angle portion of the connector is simplified because each contact assembly contains two parts that are releasably interconnected to each other within the interior of the connector body. Hence, if a right angle contact assembly located in an interior portion of the connector body behind other right angle contact assemblies lying in the same plane becomes damaged, the damaged contact assembly can be replaced by simply removing the two separate parts 96 and 98 of the assembly from the front surface 26 and face 30, respectively, of the connector body without having to remove any other right angle contacts from the connector body.

What is claimed is:

1. An interconnect assembly comprising:

a pair of circuit boards positioned generally parallel to each other;

a combined stacking and right angle connector mounted between said boards in stacked relationship;

said connector comprising an insulative body having opposite faces adjacent to said boards, and opposite side surfaces generally perpendicular to said faces;

at least one right angle contact in said body having mating sections at its opposite ends, one of said mating sections being adjacent to one of said faces and the other of said mating sections being adjacent to one of said side surfaces;

at least one stacking contact in said body having mating sections at its opposite ends each adjacent to a respective one of said faces;

connecting elements mounted in said circuit boards having mating sections releasably engaged with said mating sections of said stacking contact; and an additional connecting element mounted in said circuit board adjacent to said one face having a mating section releasably engaged with said mating section of said right angle contact adjacent to said one face.

2. An interconnect assembly as set forth in claim 1 wherein:

said mating sections of said stacking contact, and said mating section of said right angle contact adjacent to said one face, are socket contacts; and said mating sections of said connecting elements mounted in said circuit boards are pins.

3. An interconnect assembly as set forth in claim 1 wherein:

said right angle contact includes a first contact part and a separate second contact part, said contact parts being releasably connected to each within the interior of said body.

4. A combined stacking and right angle electrical connector comprising:

an insulative body having opposite faces and opposite side surfaces generally perpendicular to said faces;

at least one through hole in said body extending between said faces;

at least one right angle cavity in said body comprising a first passage opening at one of said side surfaces and a second passage generally perpendicular to said first passage and opening at one of said faces, said passages intersecting each other at an intersection point;

a first contact mounted in said hole having a central section and opposite mating end sections, said mating end sections being adjacent to said opposite faces of said body, respectively;

a right angle contact assembly mounted in said right angle cavity, said contact assembly including a first contact part and a separate second contact part, each contact part having a coupling section and a mating section;

said first contact part mounted in said first passage with its coupling section adjacent to said intersection point and its mating section adjacent to said one side surface;

said second contact part mounted in said second passage with its coupling section adjacent to said intersection point and its mating section adjacent to said one face; and said coupling sections of said first and second contact parts are interconnected at said intersection point.

5. An electrical connector as set forth in claim 4 wherein:

one of said coupling sections has a slot therein and the other coupling section is a pin firmly inserted into said slot.

6. An electrical connector as set forth in claim 5 wherein:

said one coupling section has generally a tuning fork configuration.

7. An electrical connector as set forth in claim 4 wherein:

said mating end section of said first contact and said mating section of said second contact part of said right angle contact assembly are each in the form of a socket contact.

8. An electrical connector as set forth in claim 7 in combination with a pair of circuit boards wherein:

said circuit boards are parallel to each other with said insulative body of said connector disposed between said circuit boards;

said circuit boards are mounted against said opposite faces of said insulative body; and pins mounted in circuit boards extend into said socket contact sections of said first contact and said second contact part.

9. A combined stacking and right angle electrical connector comprising:

an insulative body having opposite faces and opposite side surfaces generally perpendicular to said faces;

a plurality of through holes in said body extending between said faces;

a plurality of right angle cavities in said body each comprising a first passage opening at one of said side surfaces and a second passage generally perpendicular to said first passage and opening at one of said faces, said passages of each said cavity intersecting each other at an intersection point;

a first contact mounted in each of said holes, each said first contact having a central section and opposite socket sections, said opposite socket sections of each said first contact being adjacent to said opposite faces of said body, respectively;

a right angle contact assembly mounted in each of said right angle cavities, each said contact assembly including a first contact part and a separate second contact part, each contact part having a coupling section and a mating section;

said first contact parts mounted in said first passages with their coupling sections adjacent to said intersection points and their mating sections adjacent to said one side surface;

said second contact parts mounted in said second passages with their coupling sections adjacent to said intersection points and their mating sections adjacent to said one face; and said coupling sections of said first and second contact parts of each said contact assembly are interconnected at a corresponding intersection point.

10. An electrical connector as set forth in claim 9 wherein:

said coupling section of each said first contact part is a tuning fork-type contact having a slot therein; and said coupling section of each said second contact part is a pin firmly inserted into said slot.

11. An electrical connector as set forth in claim 10 wherein:

each said through hole and each said second passage has a circular cross-section; and each said first passage has a rectangular cross-section complementary to the configuration of said tuning fork contact.

12. An electrical connector as set forth in claim 9 wherein:

each said right angle cavity communicates to the exterior of said insulative body only where the first passage of said cavity opens at said one side surface and the second passage of said cavity opens at said one face.

13. An electrical connector as set forth in claim 9 wherein:

said right angle cavities lie in a common plane generally perpendicular to said opposite faces and said side surfaces;

the first and second passages of one of said right angle cavities are longer than the first and second passages of another of said right angle cavities;

the first contact part mounted in said first passage of said one right angle cavity is longer than the first contact part mounted in said first passage of said other right angle cavity; and the second contact part mounted in said second passage of said one right angle cavity is longer than the second contact part mounted in said second passage of said other right angle cavity.

14. An electrical connector as set forth in claim 9 in combination with a pair of circuit boards wherein:

said circuit boards are parallel to each other with said insulative body of said connector disposed between said circuit boards;

said circuit boards are mounted against said opposite faces of said insulative body; and pins mounted in circuit boards extend into said socket sections of said first contacts and said second contact parts.

15. A right angle electrical connector comprising:

an insulative body having a first face and a first side surface that lie in generally perpendicular planes;

first and second rows of passages in said body lying in a common plane and extending generally perpendicular to each other, said first and second passages extending generally perpendicular to said first face and to said first side surface, respectively;

each successive passage in said first row and in said second row being longer than the prior passage in the respective row;

each said passage having an inner end and an outer end;

the outer ends of said passages in said first row opening at first said side surface;

the outer ends of said passages in said second row opening at said first face;

said inner ends of said passages in said first row intersecting said inner ends of said passages in said second row, with the shortest passages in said rows intersecting each other, and the successively longer passages in said rows intersecting each other;

a contact mounted in each of said passages, each contact having an outer mating section and an inner coupling section, each contact having an axis and each passage having passage walls extending substantially completely around each contact axis;

the coupling sections of said contacts in said first row of passages being interconnected to the coupling sections of corresponding contacts in said second row of passages to provide a plurality of right angle contact assemblies each lying in said common plane, and the outer mating section of each contact being accessible at the corresponding first face and side surface.

16. The electrical connector set forth in claim 15 wherein:

said coupling section of each contact in said first row has a slot therein and has resilient arms on opposite sides of said slot;

said coupling section of each contact in said second row is a pin lying in said slot and clamped between said pair of resilient arms without said arms cutting into said pin.

17. The electrical connector described in claim 15 wherein:

said body has a third row of passages lying below said first row and extending parallel to said first row and separated by said passage walls from said first row, said third passages being of successively longer lengths;

said body has a fourth row of passages lying below said second row and extending parallel to said second row and separated by said passage walls from said second row, said fourth passages being of successively longer lengths;

a plurality of third contacts each mounted in one of said third passages and a plurality of forth contacts each mounted in one of said forth passages, each fourth contact having an inner end connected to an inner end of one of said third contacts.

* * * * *